(12) United States Patent
Ghosh

(10) Patent No.: US 9,602,101 B2
(45) Date of Patent: Mar. 21, 2017

(54) INTEGRATED DEVICE WITH AUTO CONFIGURATION

(71) Applicant: Atish Ghosh, Austin, TX (US)

(72) Inventor: Atish Ghosh, Austin, TX (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 128 days.

(21) Appl. No.: 14/506,071

(22) Filed: Oct. 3, 2014

(65) Prior Publication Data

US 2015/0145560 A1    May 28, 2015

Related U.S. Application Data

(60) Provisional application No. 61/887,672, filed on Oct. 7, 2013.

(51) Int. Cl.
*H03K 19/00* (2006.01)
*G06F 13/40* (2006.01)

(52) U.S. Cl.
CPC ..... *H03K 19/0002* (2013.01); *G06F 13/4068* (2013.01)

(58) Field of Classification Search
CPC .......................... H03K 19/0002; G06F 13/4068
USPC ...................................... 326/82, 38
See application file for complete search history.

(56) References Cited

U.S. PATENT DOCUMENTS

| 5,600,271 | A | 2/1997 | Erickson et al. | 327/108 |
|---|---|---|---|---|
| 6,448,812 | B1 * | 9/2002 | Bacigalupo | H03K 19/0016 326/121 |
| 6,624,656 | B1 | 9/2003 | Fox et al. | 326/41 |
| 7,484,027 | B1 * | 1/2009 | Dahlin | G06F 13/4072 710/305 |
| 8,018,250 | B1 * | 9/2011 | Klein | H03K 19/177 326/30 |
| 8,601,254 | B1 * | 12/2013 | Kutz | H03K 19/018585 326/38 |
| 9,104,571 | B2 * | 8/2015 | Ku | G06F 11/0772 |
| 2004/0205274 | A1 * | 10/2004 | Poisner | G11C 5/066 710/305 |
| 2014/0247834 | A1 * | 9/2014 | Poulsen | H04L 7/0066 370/458 |

OTHER PUBLICATIONS

International Search Report and Written Opinion, Application No. PCT/US2014/059459, 7 pages, Jan. 20, 2015.

* cited by examiner

*Primary Examiner* — Don Le
(74) *Attorney, Agent, or Firm* — Slayden Grubert Beard PLLC

(57) ABSTRACT

A method for controlling a configuration in an integrated circuit device with at least one controllable input/output port having a data output driver, a data input driver, a controllable pull-up resistor, a controllable pull-down resistor, each connected with an external pin of the integrated circuit device, has the steps of: enabling only the pull-up resistor and reading the associated input through the data input driver as a first bit; enabling only the pull-down resistor and reading the associated input through the data input driver as a second bit; tri-stating the first port and reading the associated input through the data input driver as another bit; encoding a value from the read bits; and determining a firmware operation form the encoded value.

27 Claims, 8 Drawing Sheets

Digital IO pin used for multi-bit strapping

Digital IO pin used for multi-bit strapping

INTEGRATED DEVICE WITH AUTO CONFIGURATION

CROSS-REFERENCE TO RELATED APPLICATIONS

This application claims the benefit of U.S. Provisional Application No. 61/887,672 filed on Oct. 7, 2013, which is incorporated herein in its entirety.

TECHNICAL FIELD

The present disclosure relates to a method and device for configuring an integrated circuit device.

BACKGROUND

Integrated circuit devices often need to be configured to allow operation. If configuration is limited, for example one of two operating modes need to be selected, an external pin may be either connected with ground or a supply voltage to select a configuration. However, if the number of possible configurations is higher, there may not be enough pins available to allow for a proper configuration. Thus, often, a serial interface is required by means of which the device is configured which not only increases the costs but also requires additional steps to be performed before the device can be used.

SUMMARY

Hence, there is a need for a means of automatically detecting a configuration for an integrated circuit device, in particular a microcontroller with multi-function pins.

According to an embodiment, a method for controlling a configuration in an integrated circuit device comprising at least one controllable input/output port having a data output driver, a data input driver, a controllable pull-up resistor, a controllable pull-down resistor, each connected with an external pin of the integrated circuit device, may comprise the steps: enabling only the pull-up resistor and reading the associated input through the data input driver as a first bit; enabling only the pull-down resistor and reading the associated input through the data input driver as a second bit; tri-stating the first port and reading the associated input through the data input driver as another bit; encoding a value from the read bits; and determining a firmware operation form the encoded value.

According to a further embodiment, the method may further comprise disabling the pull-up and pull-down resistors and driving the first port with a logic '0' and reading the associated input through the data input driver as a third bit; and driving the first port with a logic '1' and reading the associated input through the data input driver as a fourth bit.

According to a further embodiment, the method may further comprise accessing an external peripheral device connected with the at least one controllable input/output port to verify its presence. According to a further embodiment, an external pull-up resistor may be connected with the external pin. According to a further embodiment, an external pull-down resistor is connected with the external pin. According to a further embodiment, the steps can be repeated for each port. According to a further embodiment, for encoding six values, the external pin can be connected with one of a 200 k Ohm pull-down or pull up resistor, a 10 k Ohm pull-down or pull up resistor, a 10 Ohm or 100 Ohm pull-up or pull-down resistor.

According to another embodiment, an integrated circuit device may comprise: at least one controllable input/output port having a data output driver, a data input driver, a controllable pull-up resistor, a controllable pull-down resistor, each connected with an external pin of the integrated circuit device, a digital processor coupled with the at least one controllable input/output port and configured to: enable only the pull-up resistor and read the associated input through the data input driver as a first bit; enable only the pull-down resistor and read the associated input through the data input driver as a second bit; tri-state the first port and read the associated input through the data input driver as another bit; encode a value from the read bits; and determine a firmware operation form the encoded value.

According to a further embodiment of the integrated circuit device, the digital processor may further be configured to: disable the pull-up and pull-down resistors and drive the first port with a logic '0' and read the associated input through the data input driver as a third bit; drive the first port with a logic '1' and read the associated input through the data input driver as a fourth bit.

According to another embodiment, a system may comprise such an integrated circuit and further comprise an external peripheral connected with input/output port, wherein the digital processor is configured to access the external peripheral device connected with the at least one controllable input/output port to verify its presence. According to a further embodiment, such a system may further comprise an external peripheral connected with input/output port, wherein the digital processor is configured to access the external peripheral device connected with the at least one controllable input/output port to verify its presence. According to a further embodiment, such a system may further comprise an external pull-up resistor connected with the external pin. According to a further embodiment, such a system may further comprise an external pull-down resistor connected with the external pin. [0009] According to a further embodiment of the integrated circuit device, the digital processor may repeat configuration for a plurality of external input/output ports.

According to yet another embodiment, a system may comprise such an integrated circuit device as stated above, wherein for encoding six values, the external pin is connected with one of a 200 k Ohm pull-down or pull up resistor, a 10 k Ohm pull-down or pull up resistor, a 10 Ohm or 100 Ohm pull-up or pull-down resistor. [0009] According to a further embodiment of the integrated circuit device, the integrated circuit device can be a microcontroller.

According to yet another embodiment, a universal serial bus (USB) hub may comprise a microcontroller as stated above, and further comprise a plurality of input/output pins, each being configurable to support one of a plurality of functions.

According to a further embodiment, the USB hub may further comprise at least one power port switches, each being directly connected with one of the plurality of input/output pins, wherein the connection is free of pull-up and pull-down resistors. According to a further embodiment, the USB hub may further comprise at least one peripheral device comprising a serial interface connected with configurable associated input/output ports of the microcontroller, wherein each connection comprises a pull-up resistor. According to a further embodiment, the USB hub may further comprise at least one fuse coupled between a power supply and a power output of the USB hub, and a voltage divider associated with the at least one fuse coupled between the power output and ground, wherein a voltage dividing

DETAILED DESCRIPTION

Port Type Detection

The following describes in some embodiments the configuration of a universal serial bus (USB) Hub. However, the method and system for configuration may apply for other integrated circuit devices, in particular microcontrollers with multi-function pins.

A USB Hub may comprise a microcontroller that needs to be configured to control the power for each of its downstream ports using, for example, an external port power controller. There are three basic types of such power controllers. One is a simple polyfuse, which is a basically a thermistor. The second is a standard port power controller that has an enable pin input, and an over-current detect output. The third is controlled through a serial bus, for example an I2C controlled device that is controlled through I2C messages. One example for such a serial bus is used in "LINX" devices described here below and uses a proprietary device that comprises an I2C physical bus with an extra ALERT pin, with proprietary messages. Thus, a LINX bus comprises a data I/O line, a clock line, and an alert line. However, this type of communication interface is only one example, according to other embodiments, the scheme can be extended to any I2C device or other serial communication bus whenever a device such as an USB hub comprises serial communication ports. Normally, the port type must be programmed into the hub with a programmable setting, or controlled through a strap. According to various embodiments as outlined below, it will become possible that the controller type attached to the hub downstream ports is automatically detected. As mentioned above, the following principle may be used for other integrated circuit devices that require configuration.

The automatic detection according to various embodiments alleviates the need for programming the device with the type of port device attached to it. This also alleviates a step for a user. As mentioned above, such an automatic detection can be used for other configuration purposes.

According to an embodiment, the number of permutations may be restricted to the following in case of a USB hub with for example four USB ports.

1. One poly fuse per port.
2. One poly fuse per system. (Only briefly described here)
3. One port power controller per downstream port.
4. One to three I²C LINX ports. Remaining ports used a ganged poly fuse.
5. One to three I²C LINX ports. Remaining ports used a ganged port power switch.
6. Four I²C LINX ports.

Whether a port has battery charging support may be determined by the a so-called BC_EN strap. For example, battery charging may not be supported for ports that have poly fuses. Battery charging may only be supported on ports that have either a port power switch or an I2C LINX port.

The system designer is required to use a port power controller of the correct size before enabling the port.

Identifying Port Type

Figure 1:
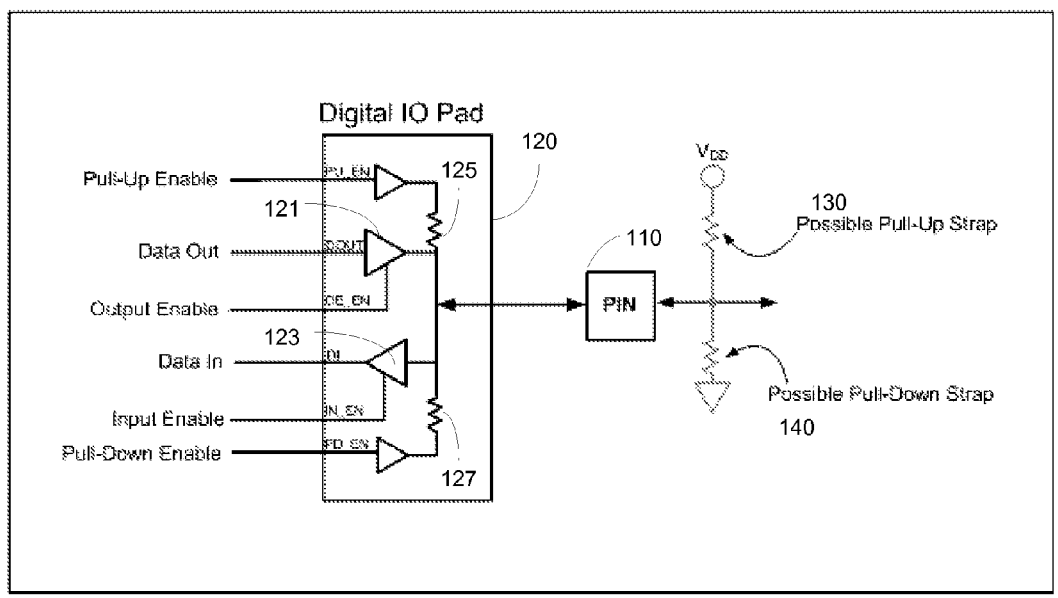
FIG. 1 shows a block diagram of a typical I/O port and associated external pin as well as externally applied pull-up and pull-down resistors.

The identification of a port makes use of the internal pull-down resistors 127 available in peripheral input/output (PIO) mode within a peripheral input/output port 120 as shown in FIG. 1. Such ports 120 are typical input/output (I/O) ports of a microcontroller or integrated circuit device and are generally organized to be 8 bit or 16 bit wide. However, more or less bits may be provided for an I/O port. The resistor values of the pull-down resistor 127 generally vary between 30K and 80K. According to a specific example, a port power switch will have no resistors attached to an external pin 110. A LINX port, as discussed above, will have the 10K pull-up resistor 130 as required for I2C connected to the port 110. A poly Fuse will have a resistor divider 130/140 connected to the port 110 to bring the 5 Volt VBUS down to 3.3V levels. The resistor divider that will be required for this port can be a 10K pull-up resistor 130 with a 10K pull-up down resistor 140.

If the internal weak pull-down resistor 127 is unable to pull-down the pin 110, then there is an external pull-up resistor 130 present that is much stronger than the pull-down resistor 127. If a pull-up is detected, then, for example, an access to the connected device may be performed to distinguish between port configuration that must use the same pull-down or pull-up resistor. For example, for an access to the LINX device can be performed to distinguish between a poly fuse and a LINX interface.

According to various embodiments, to identify a configuration, for example in case of a four port USB hub, the four ports are put into non-combined mode. FIG. 1 shows a typical microcontroller I/O port 120 having a Data Out driver 121 with an output enable function, and a Data In driver 123 with an enable function. In addition, a pull-up resistor 125 or a pull-down resistor 127 can be activated through respective control signals.

The pull-down resistor 127 is applied to an associated port pin 110 using the pull-down enable control signal "Pull-Down Enable" of the corresponding PIO 120. Then, the pin input of the respective port 110 is determined by reading a respective value from the enabled input driver 123. By this it can be identified, which pins have pull-ups and which do not.

According to various embodiments, an external pin of an integrated circuit device may be used for configuration and can be externally encoded, for example, to one of six values. The values are determined by external resistors 130 and 140 as shown in FIG. 1.

According to an embodiment, the resistor options are, a 200KΩ pull-down, 200KΩ pull-up, 101KΩ pull-down, 101KΩ pull-up, 100KΩ down-up, 100KΩ pull-up. The internal pull-downs and pull-ups have a nominal value of, for example, 50Ω. However, other values may apply and the external resistors may have different values for an optimized operation. For example, the smallest resistor may as well have a nominal value of 10Ω if a respective driver has a driver strength that could not be overridden by a 100Ω resistor according to one embodiment. Other embodiments may use different values adapted the respective internal drivers and internal pull-up and pull-down resistors.

The firmware then determines the value of the external resistor by monitoring the input value, and in sequence applying the internal pull-down resistor, then the internal pull-up resistor, then driving a zero, then driving a one, and finally outputting a tri-state. At each instance, the input value is recorded. A vector can then be created using the determined input values. According to an embodiment, this may result in six different vectors or encoding values. The vector can then be used as it points to a specific configuration. Table 1 shows an example of reading values for different pull-up or pull-down resistors applied to a pin. The respective resistor values selected for a specific function of the respective pin may be selected such that the value allows for optimal performance of that function. The determination of each bit/steps "PULL DOWN", "PULL UP", "DRIVE 0", "DRIVE 1", and "TRI STATE" may be performed in any order. Depending on how many different vectors/encoding values are needed, not all of the bits/steps may be used.

TABLE 1

| STRAP | PULL DOWN | PULL UP | DRIVE 0 | DRIVE 1 | TRI-STATE | VALUE | ENCODING |
|---|---|---|---|---|---|---|---|
| 200 KΩ PD | 0 | 1 | 0 | 1 | 0 | 0x0A | Value 1 |
| 200 KΩ PU | 0 | 1 | 0 | 1 | 1 | 0x0B | Value 2 |
| 10 KΩ PD | 0 | 0 | 0 | 1 | 0 | 0x02 | Value 3 |
| 10 KΩ PU | 1 | 1 | 0 | 1 | 1 | 0x1B | Value 4 |
| 100 Ω PD | 0 | 0 | 0 | 0 | 0 | 0x00 | Value 5 |
| 100 Ω PU | 1 | 1 | 1 | 1 | 1 | 0x1F | Value 6 |
| No Resistor | 0 | 1 | 0 | 1 | X | 0x0A/0x0B | Not Allowed |

Thus, a plurality of different configuration values can be chosen with a single digital port whose functionality may not be influenced or significantly altered by a respective pull-up or pull-down resistor. The respective pull-up or pull down values can be selected accordingly. A microcontroller as discussed below may have such ports wherein a plurality of such ports are connected with external multi-function pins that require configuration according to a desired function, in particular according to a connected device.

The following discusses a specific example of a USB hub controller 210 comprising a CPU 230 and associated memory 240 as well as a plurality of integrated peripheral devices 250 . . . 260. Controller 210 can be a microcontroller with firmware that requires configuration of its ports according to various embodiments of this disclosure. The digital processor 230 is coupled with each its ports and operable to configure each port using special function registers which may use one or more bits to set certain functionality such as enabling pull-up or pull-down functions, data direction, tri-state, connection to other peripheral devices such as serial interfaces, timers, analog-to-digital converters, etc. the special function registers can be memory-mapped in memory 240 to provide easy access for the digital processor 230.

According to one embodiment, having a pull-up means that the port either has a pull-up resistor connected to the pin 110, for example, as will be the case for the LINX interface, or it has a pull-up for the poly fuse. According to an embodiment, for example a USB hub with four ports, there may be only three valid combination. For example, all ports have pull-ups, or no port has pull-ups or ports 1 through 3 have pull-ups and port 4 does not. All other combinations may then default to a configuration with four poly-fuses.

According to an embodiment, again in case of a USB hub with four ports, the table 2 can be used as shown below, to map individual PIO of the controller to the respective USB port. The shown PIO's are mere examples of available ports. Other ports may be provided and used for other purposes. Firmware in the controller may be designed to automatically configure each port as necessary according to the various embodiments disclosed here.

TABLE 2

| PORT | PIO |
|---|---|
| 1 | PIO17 |
| 2 | PIO18 |
| 3 | PIO19 |
| 4 | PIO20 |

The one poly fuse per system is not discussed here. For systems that use only one poly fuse, the poly fuse may be attached to the upstream port. Any over current sense (OCS) event that occurs resets the whole system, and is independent of anything the hub does. After an OCS event, the whole hub goes through an enumeration cycle. Table 3 shows the possible encoding using pull-up resistors for a USB hub with four ports. In this embodiments, the limited number of configurations allows to only use pull-up resistors, in particular pull-up resistors with the same value.

TABLE 3

| PORT1 | PORT2 | PORT3 | PORT4 | ENCODING |
|---|---|---|---|---|
| No Pullup | No Pullup | No Pullup | No Pullup | One port power controller per downstream port |
| Pullup | Pullup | Pullup | No Pullup | LINX interface present. All non LINX ports are ganged using a single port power switch. |
| Pullup | Pullup | Pullup | Pullup | LINX interface if LINX device found on interface. All non LINX ports are ganged using a single poly fuses. If no LINX device found on interface, all devices use individual poly fuses. |
| All other combinations invalid | | | | Invalid, go to default. Default is one port power controller per downstream port. |

Port Power Switch Only Port Control

Figure 2:
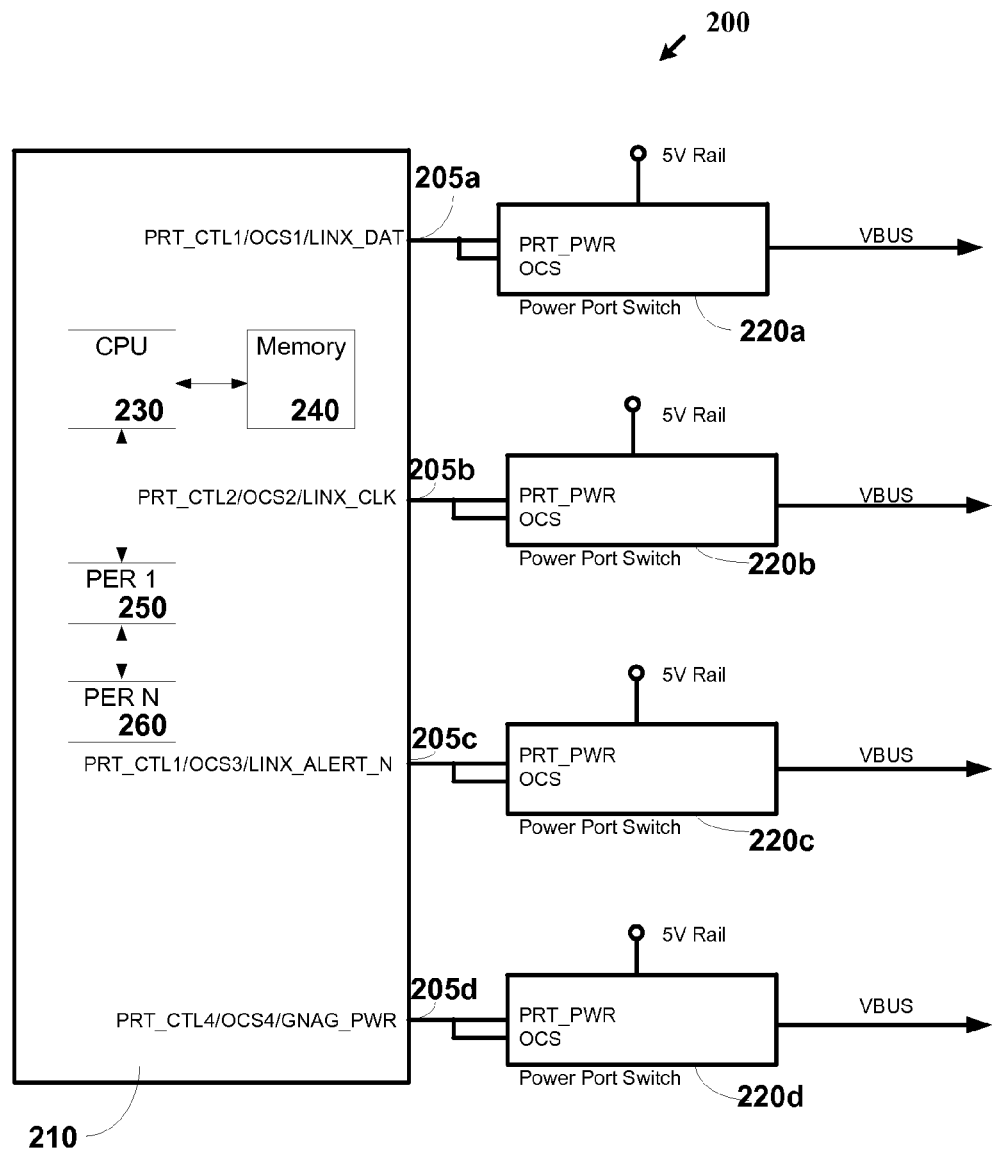
FIG. 2 shows a block diagram of a USB hub in a first configuration.

If there is no pull-up on any of the ports, then the port has one port power switch per port. In this situation, all the ports are put into combined mode. FIG. 2 shows a port power control system 200 using port switches only. USB controller 210 has four external multi-function pins 205*a* . . . *d* that are coupled with respective I/O ports 120 as shown in FIG. 1.

The multi-function pins 205a . . . d can be one of three functions as indicated in FIG. 2. For example, pin 205a, supports a port control function, an over current sense function, or the data line of a LINX interface. Pin 205b, supports a port control function, an over current sense function, or the clock line of a LINX interface. Pin 205c supports a port control function, an over current sense function, or the alert in signal function of a LINX interface. Pin 205d supports a port control function, an over current sense function, or a ganged power control function. However, more or less functions may apply according to other embodiments. In this example, no resistors are connected to the ports to define this configuration.

LINX Port with Poly Fuse

Figure 3:
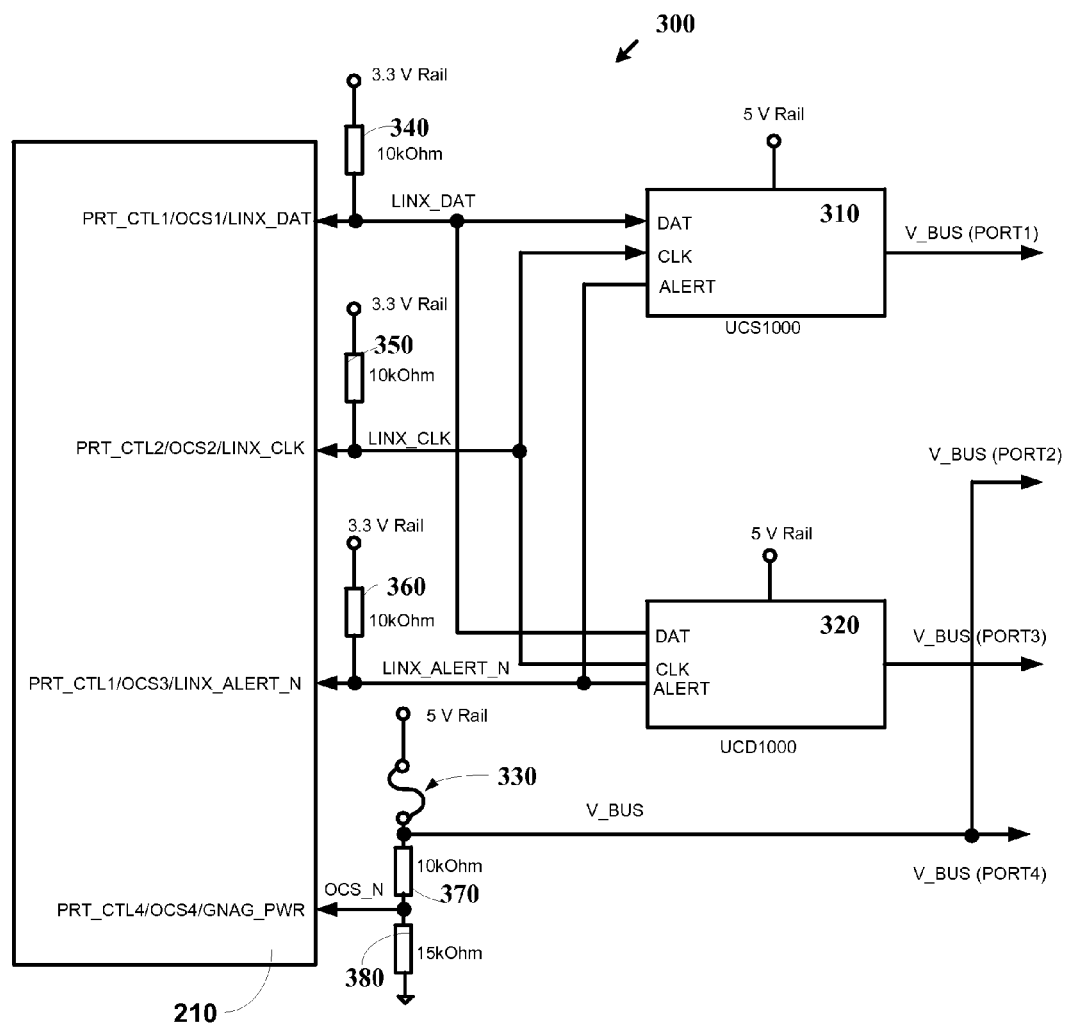
FIG. 3 shows a block diagram of a USB hub in a second configuration.
Figure 4:
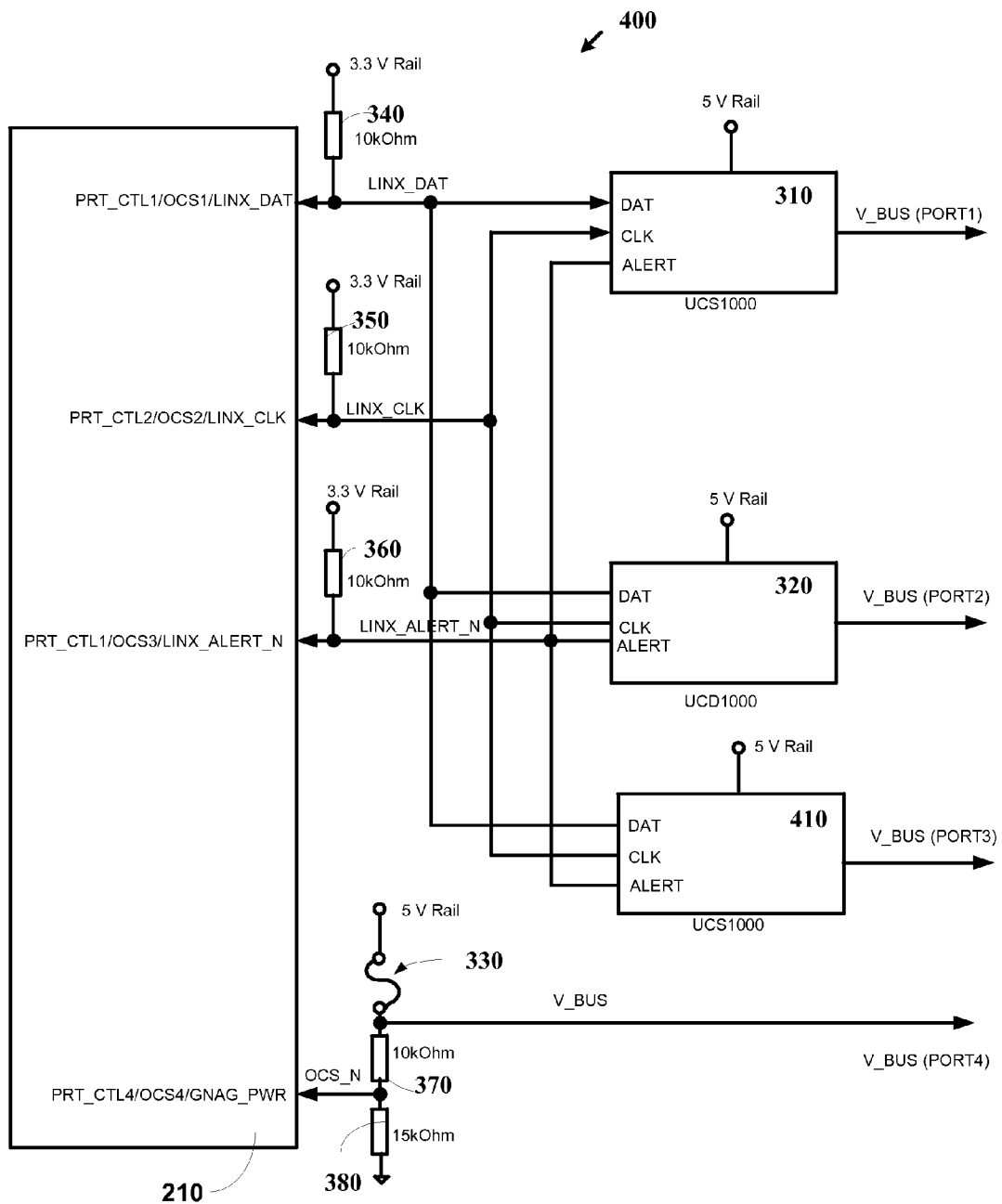
FIG. 4 shows a block diagram of a USB hub in a third configuration.

If ports 1, 2, 3 and 4 all have pull-up resistors, there are two possibilities. There is a LINX port on three of the lines and a poly-fuse on the fourth line, or there are four poly fuses only. A detection on the LINX interface is performed. If there is a response at address 0x30, or 0x31 or 0x32 or 0x33, then there is a LINX device present. Port 1=0x30, port 2=0x31, port 3=0x33. One to four LINX device may be present. They do not have to be sequential. All ports that do not have an LINX devices must be put into ganged mode. For example, if ports 2 and 4 do not have LINX devices, then PORT_CFG_SEL_2 and PORT_CFG_SEL_4 both must have the GANG_PIN set. COMBINED_MODE is cleared because of the poly fuse. FIG. 3 shows port power control system 300 using two LINX ports 310, 320 and poly Fuse 330. Resistors 340, 350, and 360 are used to pull up the respective controller ports as shown. Resistor divider 370 and 380 is used to configure the four port as a poly fuse. FIG. 4 shows port power control system 400 using three LINX ports 310, 320, and 410 and one poly Fuse 330.

Poly Fuse Only Port Power Control

Figure 5:
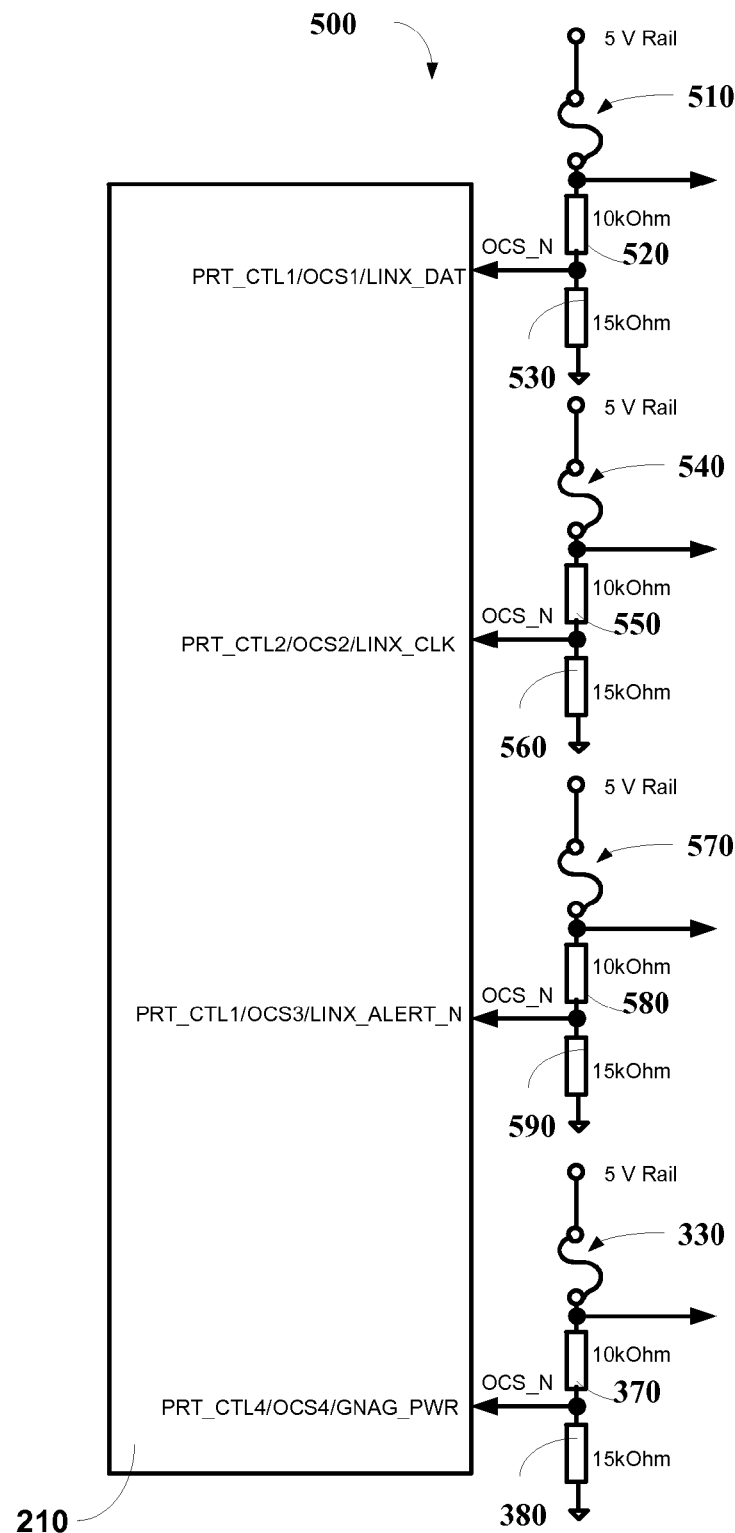
FIG. 5 shows a block diagram of a USB hub in a fourth configuration.

If ports 1, 2, 3 and 4 all have pull-up resistors, and no LINX device was detected, then all the ports have poly fuses as shown in FIG. 5 which shows port power control system 500 using poly fuses 510, 540, 570, and 330 only. Each port is connected with a resistor divider 520/530, 550/560, 580/590, and 370/380. The following may be performed:

1. Disable the I2C interface.
2. Set all the port to non-combined mode. By setting all the ports into non-combined mode, the port power output is ignored, and the pin becomes an OCS only.
3. The GANG_PIN is cleared in all registers.

In this configuration all pins are used as over current sense pins.

LINX Port with Port Power Switch

If ports 1, 2, and 3 all have pull-up resistors, and port 4 does not, it means that there is a LINX interface, and the remaining ports use a port power switch. Do a detection on the LINX interface. If there is a response at address 0x30, or 0x31 or 0x32 or 0x33, then there is a LINX device at present. Port 1=0x30, port 2=0x31, port 3=0x33. One to four LINX device may be present. They do not have to be sequential. All ports that do not have an LINX devices must be put into ganged mode. For example, if port 1 is the only LINX device, then PORT_CFG_SEL_2, PORT_CFG_SEL_3 and PORT_CFG_SEL_4 both must have the GANG_PIN set. COMBINED_MODE must be set because of the presence of a port power switch.

Figure 6:
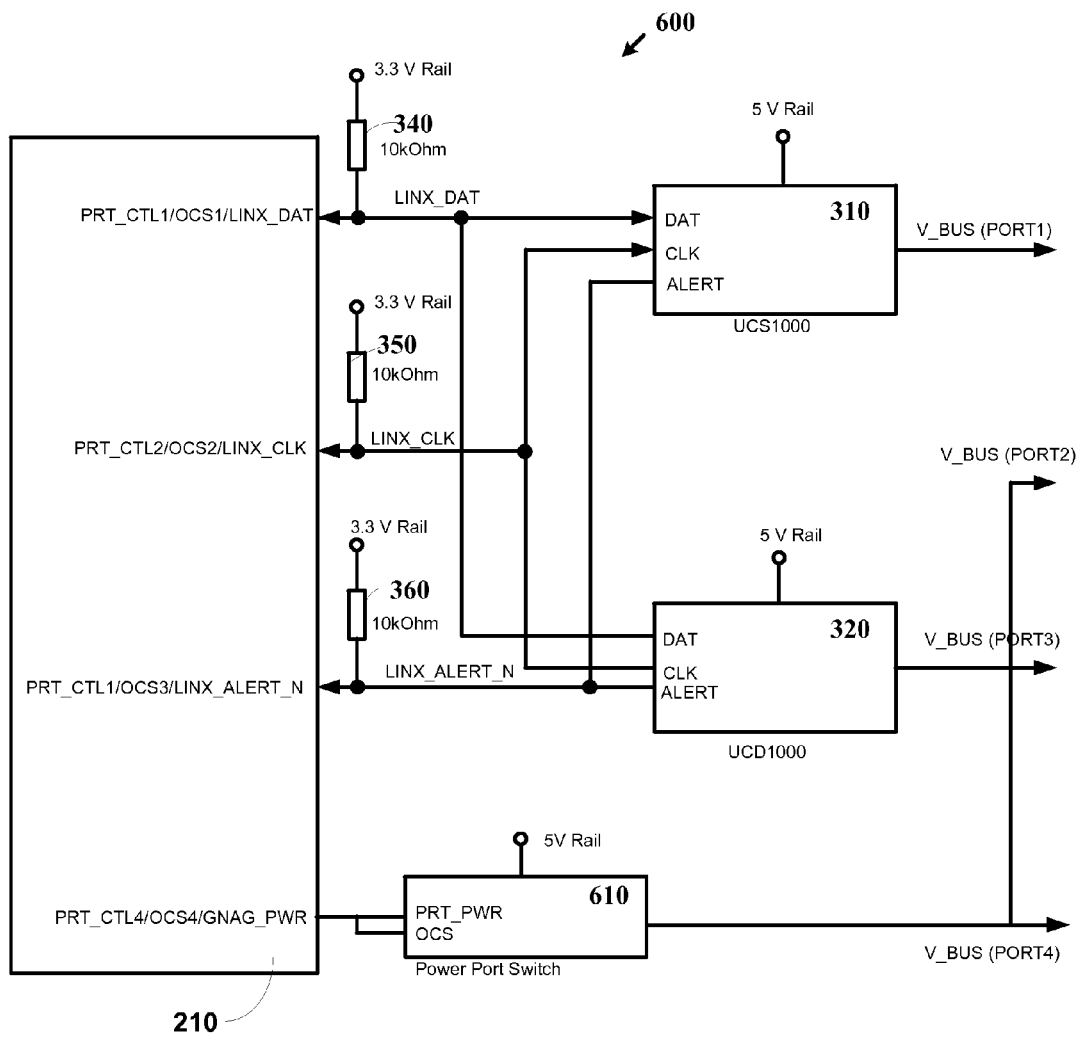
FIG. 6 shows a block diagram of a USB hub in a fifth configuration.
Figure 7:
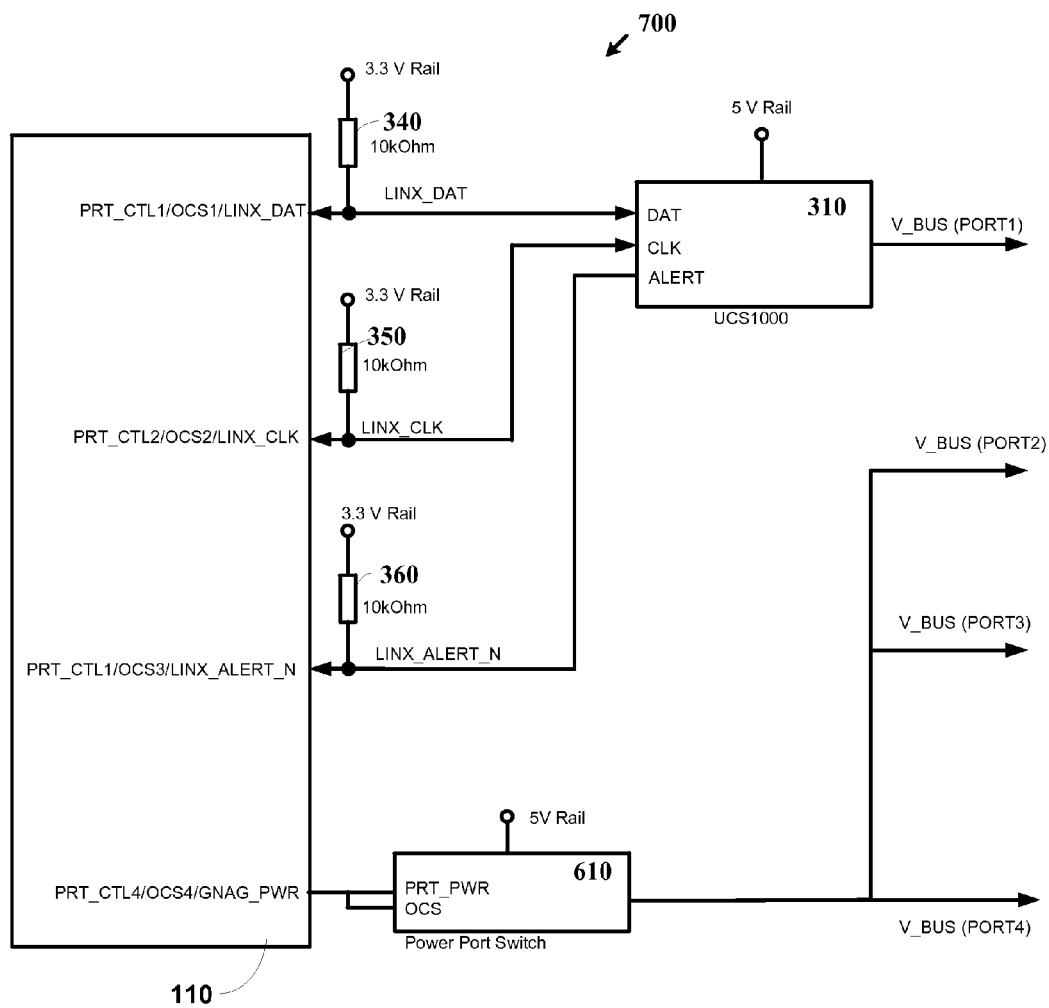
FIG. 7 shows a block diagram of a USB hub in a sixth configuration.

FIG. 6 shows a system 600 with two LINX Ports 310, 320 and Port power switch 610 as an example of two LINX devices and a port power controller. FIG. 7 shows a system 700 with one LINX port 310 and one port power switch 610.

LINX Only Port Configuration

Figure 8:
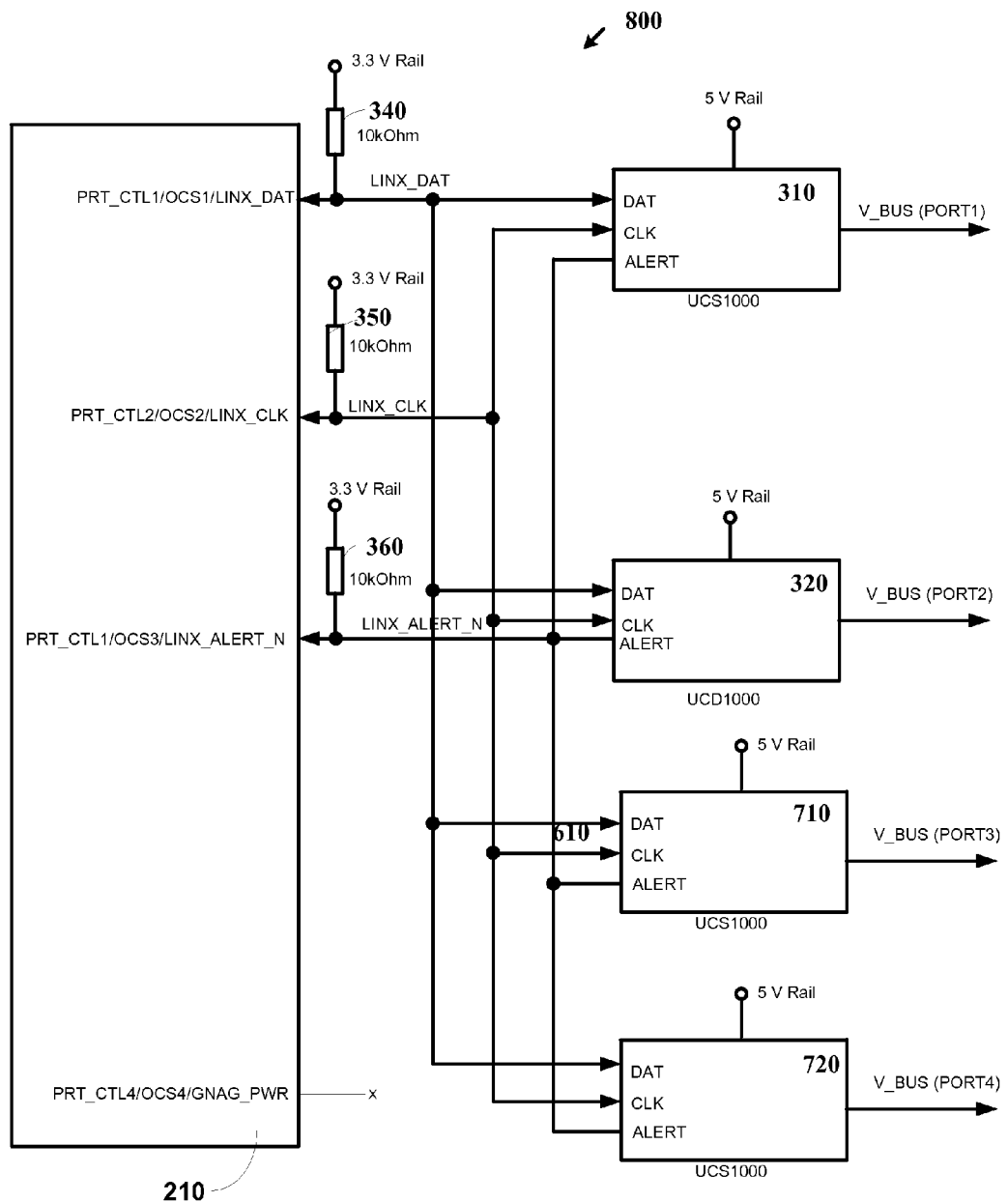
FIG. 8 shows a block diagram of a USB hub in a seventh configuration.

If a LINX device is attached, then ports 1, 2, and 3 must all have pull-up resistors. If there are four LINX devices attached, then port 4 will not be used. It is a full LINX system, and the presence of a resistor on port 4 does not matter. For a full LINX system, the state of the COMBINED_MODE, GANG_PIN for the various registers do not make a difference. Everything is done through the LINX interface. The firmware is responsible for turning the ports on and off, and managing OCS events. If there are less than four LINX devices attached, the remaining non-LINX devices are be attached in gang mode using the port 4. If there is a resistor on port 4, then the non-LINX devices are assumed to attached with a poly-fuse device, and must be used COMBINED_MODE. If there is no resistor on port 4, then non-LINX devices are assumed to be attached with port power controllers. COMBINED_MODE must be used. FIG. 8 shows a system 800 with four LINX ports 310, 320, 710, and 720 only.

What is claimed is:

1. Method for controlling a configuration in an integrated circuit device comprising at least one controllable input/output port having a data output driver, a data input driver, a controllable pull-up resistor, a controllable pull-down resistor, each connected with an external pin of the integrated circuit device, the method comprising;
    enabling only the pull-up resistor and reading the associated input through the data input driver as a first bit;
    enabling only the pull-down resistor and reading the associated input through the data input driver as a second bit;
    tri-stating the first port and reading the associated input through the data input driver as another bit;
    encoding a value from the read bits; and
    determining a firmware operation form the encoded value.
2. The method according to claim 1, further comprising disabling the pull-up and pull-down resistors and
    driving the first port with a logic '0' and reading the associated input through the data input driver as a third bit;
    driving the first port with a logic '1' and reading the associated input through the data input driver as a fourth bit.
3. The method according to claim 1, further comprising accessing an external peripheral device connected with the at least one controllable input/output port to verify its presence.
4. The method according to claim 2, further comprising accessing an external peripheral device connected with the at least one controllable input/output port to verify its presence.
5. The method according to claim 1, wherein an external pull-up resistor is connected with the external pin.
6. The method according to claim 1, wherein an external pull-down resistor is connected with the external pin.
7. The method according to claim 2, wherein an external pull-up resistor is connected with the external pin.
8. The method according to claim 2, wherein an external pull-down resistor is connected with the external pin.
9. The method according to claim 1, wherein the steps are repeated for each port.
10. The method according to claim 2, wherein the steps are repeated for each port.
11. The method according to claim 2, wherein for encoding six values, the external pin is connected with one of a 200 k Ohm pull-down or pull up resistor, a 10*k* Ohm pull-down or pull up resistor, a 10 Ohm or 100 Ohm pull-up or pull-down resistor.

12. An integrated circuit device comprising:
   at least one controllable input/output port having a data output driver, a data input driver, a controllable pull-up resistor, a controllable pull-down resistor, each connected with an external pin of the integrated circuit device,
   a digital processor coupled with the at least one controllable input/output port and configured to:
   enable only the pull-up resistor and read the associated input through the data input driver as a first bit;
   enable only the pull-down resistor and read the associated input through the data input driver as a second bit;
   tri-state the first port and read the associated input through the data input driver as another bit;
   encode a value from the read bits; and
   determine a firmware operation form the encoded value.

13. The integrated circuit device according to claim 12, wherein the digital processor is further configured to:
   disable the pull-up and pull-down resistors and
   drive the first port with a logic '0' and read the associated input through the data input driver as a third bit;
   drive the first port with a logic '1' and read the associated input through the data input driver as a fourth bit.

14. A system comprising the integrated circuit device according to claim 12, further comprising an external peripheral connected with input/output port, wherein the digital processor is configured to access the external peripheral device connected with the at least one controllable input/output port to verify its presence.

15. A system comprising the integrated circuit device according to claim 13, further comprising an external peripheral connected with input/output port, wherein the digital processor is configured to access the external peripheral device connected with the at least one controllable input/output port to verify its presence.

16. A system comprising the integrated circuit device according to claim 12, further comprising an external pull-up resistor connected with the external pin.

17. A system comprising the integrated circuit device according to claim 12, further comprising an external pull-down resistor connected with the external pin.

18. A system comprising the integrated circuit device according to claim 13, further comprising an external pull-up resistor connected with the external pin.

19. A system comprising the integrated circuit device according to claim 13, further comprising an external pull-down resistor connected with the external pin.

20. The integrated circuit device according to claim 12, wherein the digital processor repeats configuration for a plurality of external input/output ports.

21. The integrated circuit device according to claim 13, wherein the digital processor repeats configuration for a plurality of external input/output ports.

22. A system comprising an integrated circuit device according to claim 13, wherein for encoding six values, the external pin is connected with one of a 200 k Ohm pull-down or pull up resistor, a 10 k Ohm pull-down or pull up resistor, a 10 Ohm or 100 Ohm pull-up or pull-down resistor.

23. The integrated circuit device according to claim 12, wherein the integrated circuit device is a microcontroller.

24. A universal serial bus (USB) hub comprising a microcontroller according to claim 23, further comprising:
   a plurality of input/output pins, each being configurable to support one of a plurality of functions.

25. The USB hub according to claim 24, comprising at least one power port switches, each being directly connected with one of the plurality of input/output pins, wherein the connection is free of pull-up and pull-down resistors.

26. The USB hub according to claim 24, comprising at least one peripheral device comprising a serial interface connected with configurable associated input/output ports of the microcontroller, wherein each connection comprises a pull-up resistor.

27. The USB hub according to claim 24, comprising at least one fuse coupled between a power supply and a power output of the USB hub, and a voltage divider associated with the at least one fuse coupled between the power output and ground, wherein a voltage dividing node of the voltage divider is connected with one input/output port of the microcontroller.

* * * * *